United States Patent
Chien et al.

[11] Patent Number: 5,888,861
[45] Date of Patent: Mar. 30, 1999

[54] METHOD OF MANUFACTURING A BICMOS INTEGRATED CIRCUIT FULLY INTEGRATED WITHIN A CMOS PROCESS FLOW

[75] Inventors: Chung-Jen Chien, Saratoga; Jeong Y. Choi, Palo Alto; Chuen-Der Lien, Los Altos Hills, all of Calif.

[73] Assignee: Integrated Device Technology, Inc., Santa Clara, Calif.

[21] Appl. No.: 870,474

[22] Filed: Jun. 6, 1997

[51] Int. Cl.$^6$ .............................................. H01L 21/8238
[52] U.S. Cl. .......................................... 438/202; 438/234
[58] Field of Search .................................. 438/202, 203, 438/204, 205, 207, 234, 236

[56] References Cited

U.S. PATENT DOCUMENTS

| | | | |
|---|---|---|---|
| 4,764,482 | 8/1988 | Hsu .......................................... | 438/207 |
| 4,855,245 | 8/1989 | Neppl et al. ............................. | 438/207 |
| 4,912,055 | 3/1990 | Min et al. ................................ | 438/243 |
| 5,290,714 | 3/1994 | Onozawa ................................. | 438/207 |
| 5,366,907 | 11/1994 | Sasaki .................................... | 438/207 |
| 5,597,757 | 1/1997 | Maeda et al. .......................... | 438/234 |
| 5,776,807 | 7/1998 | Ronkainen et al. .................... | 438/234 |

OTHER PUBLICATIONS

Embabi et al. , "Digital BiCMOS Integrated Circuit Design," Kluwer Academic Publishers (1993), pp. 32–38. no month.

*Primary Examiner*—Tuan H. Nguyen
*Attorney, Agent, or Firm*—Skjerven, Morrill, MacPherson, Franklin & Friel

[57] ABSTRACT

A process for manufacturing a BiCMOS integrated circuit is implemented by adapting the masking and doping steps used in forming CMOS devices. Thus simultaneous formation of both CMOS and bipolar device structures eliminates the need for any additional masking or process steps to form bipolar device structures. Collector regions 20 of NPN transistors are formed simultaneously with N-wells 18. Collector regions of PNP transistors, if required, are formed simultaneously with P-wells 16. Base regions 24 of the bipolar transistors are formed using threshold voltage implant steps and/or lightly doped drain implant steps of PMOS transistors. Emitter regions 59 are formed, when using a single polysilicon CMOS process, simultaneously with the CMOS gates 72, 74. When employing a double polysilicon CMOS process, the emitter regions 59 are formed concurrently with the second polysilicon layer interconnect structure and/or source/drain regions 50,52 of NMOS transistors. For single polysilicon CMOS process, the buried layer regions 66 are formed during buried contact formation.

29 Claims, 4 Drawing Sheets

METHOD OF MANUFACTURING A BICMOS INTEGRATED CIRCUIT FULLY INTEGRATED WITHIN A CMOS PROCESS FLOW

BACKGROUND

1. Field of the Invention

This invention relates generally to a method for fabricating semiconductor devices. More specifically it relates to processes for forming BiCMOS devices.

2. Description of Related Art

Semiconductor integrated circuits that have both bipolar and CMOS device structures are known as BiCMOS circuits. These BiCMOS circuits can often combine the advantages of the high speed bipolar device structures with the high power performance of CMOS device structures to result in a solution neither technology could offer alone.

However, when fabricating such a BiCMOS integrated circuit, it is often found necessary to insert bipolar processing steps at various points into the CMOS process flow to realize the desired device characteristics. Thus, a typical BiCMOS integrated circuit process will have more process steps than either a bipolar or CMOS process taken singly. For example, Embabi et al. in "Digital BiCMOS Integrated Circuit Design", Kluwer Academic Publishers p. 32–38 (1993), summarize BiCMOS processes as falling into one of three categories, Low Cost; Medium Performance; and High Performance. Low Cost processes are described as requiring only one additional masking step and produce bipolar devices with low cut-off frequencies ($f_T$) and poor current drive. Medium Performance processes are described as requiring only three additional masking steps and produce devices having $f_T$ approaching 5 gigahertz (GHz) with better current drive. Finally, High Performance processes are described as requiring at least four additional masking steps and produce devices having $f_T$ in excess of 5 GHz.

These additional process steps, required to integrate bipolar devices into a CMOS process, undesirably increase the complexity and cost of the fabrication process. In some cases, this increase in complexity and cost outweighs the advantages in circuit performance realized by the BiCMOS structure. For example a process yielding bipolar NPN transistors with a cut-off frequency in excess of 10 gigahertz (GHz), could require more than four additional masking and doping steps rendering its use commercially infeasible, whereas a circuit produced without additional steps would be a commercial success.

Furthermore, the typical high performance BiCMOS process requires the formation of an epitaxial layer which may be problematic. Modern fabrication techniques allow the thickness of the epitaxial layer to be controlled only to within approximately 0.05 to 0.1 $\mu$m. Thus, where it is desired to form an epitaxial layer of 0.5 $\mu$m, a processing error of approximately 10 to 20% is introduced. Additionally, the surface cleaning required before epitaxial growth, and the annealing of the buried layer, not only increases costs but also consumes valuable time.

Therefore, it would be desirable to form high performance BiCMOS structures without requiring any additional masking and/or doping steps beyond those typically used in forming CMOS devices. In addition, it would be desirable to form high performance BiCMOS structures without requiring formation of an epitaxial silicon layer. In this manner, process complexity is minimized and cost reduced.

SUMMARY

A BiCMOS process is disclosed herein which overcomes problems discussed above. In accordance with the present invention, masking and doping steps used in forming CMOS devices are modified so as to simultaneously form corresponding components of bipolar devices, thereby eliminating the need for additional masking steps.

Thus collector regions of NPN transistors are formed simultaneously with N-wells. For a single polysilicon CMOS process, base regions are formed using threshold voltage implant masking steps and emitter regions are formed simultaneously with the CMOS gates. When employing a double polysilicon CMOS process, base regions are formed using threshold voltage implant masks and/or lightly doped drain implant masks and emitter regions are formed concurrently with formation of the polysilicon interconnect structure.

In one embodiment, an N+ buried layer is formed by implanting high energy dopants through collector regions using an oversized mask which leaves exposed only collector regions. In another embodiment, N+ buried layers are formed subsequent to opening emitter regions.

In this manner, embodiments in accordance with the present invention realize a bipolar process embedded in CMOS technology, thereby allowing for fabrication of high performance BiCMOS devices without significantly increasing the complexity and cost of the CMOS process.

DETAILED DESCRIPTION

Embodiments of the present invention will be described with reference to structure 10 of FIGS. 1–6 and structure 100 of FIGS. 7–12. These drawings are simplified for ease of understanding and description only and various modifications will become apparent to those skilled in the art as embodiments of the present invention are described. For example, while a method for forming a NPN transistor is described hereinbelow, a person of ordinary skill in the art will understand that such a method could be adapted to form a PNP transistor. All such modifications, variations or adaptations that rely upon the teachings of the present invention, and through which these teachings have advanced the art, are considered to be within the spirit and scope of the present invention.

Figure 1:
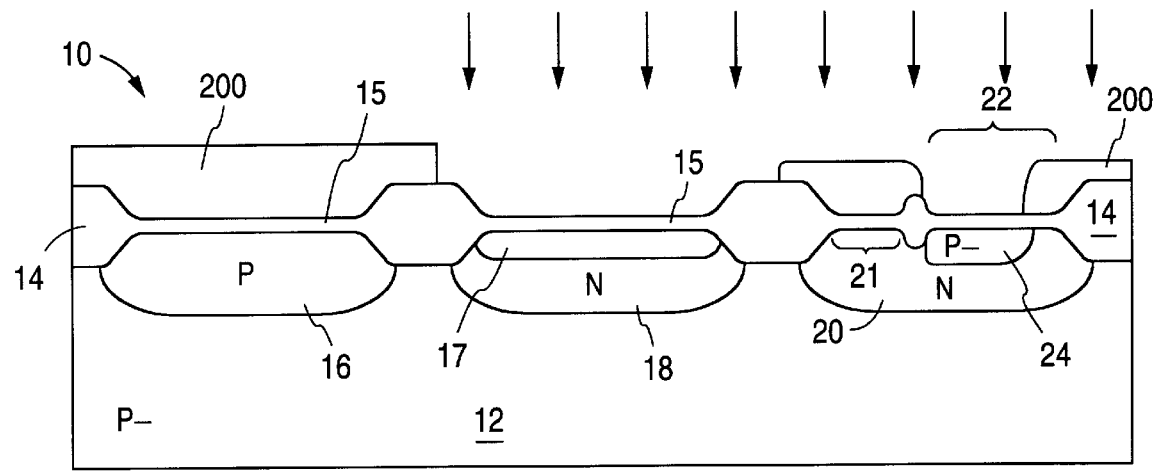
FIGS. 1, 2, 3, 4, 5 and 6 are simplified cross-sectional views of a semiconductor structure illustrating various steps in the fabrication of a BiCMOS integrated circuit employing a double polysilicon CMOS process embodiment of the present invention.

Turning to FIG. 1, a simplified cross-sectional view of structure 10 at an early step of a double polysilicon CMOS process flow is shown. Structure 10 includes a P-type substrate 12 having a thickness between approximately 500 to 1000 micrometers ($\mu$m) and having a resistivity of between approximately 1 to 20 ohm-centimeter ($\Omega$-cm). Of course, the resistivity and thickness of substrate 12 will in actual embodiments depend upon the desired characteristics of the devices to be formed therein. The conductivity types described with respect to structure 10 may alternatively be reversed while still realizing the benefits of the invention.

Structure 10 also includes a P-well 16, an N-well 18, an N-type collector 20, a field oxide layer 14 and a sacrificial oxide layer 15. P-well region 16, N-well region 18 and N-collector region 20 are formed using conventional masking and doping processes well known in the art. In one embodiment, P-well 16 is doped P-having a conductivity of approximately 1 to 10 kΩ/square and both N-well 18 and collector 20 are doped N– having a conductivity of approximately 0.5 to 5 kΩ/square. Field oxide 14 is formed using a well known isolation process such as Localized Oxidation of Silicon (LOCOS), so as to provide electrical isolation for each well and collector region, as is known. Additionally, field oxide 14 provides a segmented structure 21, 22 for N-type collector 20. As will be seen, this segmented structure 21, 22 provides for separation of collector and base contacts of the NPN transistor to be formed therein. Such a segmented structure is readily formed by removing selected portions of an oxidation mask (not shown) during said well known LOCOS process. As those of skill in the art know, segmented structure 21, 22 is not a requirement and embodiments of the present invention with a non-segmented N-type collector 20 can be formed and are within the scope and spirit of this invention. However, for ease of understanding of embodiments where segmented structure 21, 22 is employed only, all illustrations include such a structure. Where it is desired to form PNP transistors, P-type collectors can be formed using well known process steps and a segmented collector structure analogous to that of N-collector 20 can also be formed if desired.

A first masking layer 200 is disposed over substrate 12 and patterned to expose selected portions of N-well region 18 and segment 22 of collector region 20. The aforementioned portions of N-well 18 and segment 22 of collector 20 are implanted using a P-type dopant, for example boron, at an energy of between approximately 30 to 90 thousand electron volts (keV) with a dose of between approximately $1\times10^{12}$ to $1\times10^{3}$ ions/cm$^2$. Such an implantation is typically used to adjust the threshold voltages of PMOS transistors. However, here it is conveniently used to simultaneously form an extrinsic base region 24 in collector 20 and a threshold voltage adjust region 17 in N-well 18. In some embodiments, first masking layer 200 is altered and extrinsic base region 24 is not formed concurrently with threshold voltage adjust implantation of N-well 18. As will be seen in FIG. 3, in such embodiments base region 24 can be formed simultaneously with lightly doped source and drain regions 30 and 32. In other embodiments, masking layer 200 is not formed, and P-type dopant is blanket implanted into substrate 12 thus providing for formation of base region 24 and threshold adjust region 17. In addition, P-well region 16 may also be doped for threshold voltage adjustment, using a different masking layer (not shown), with an N-type dopant.

Figure 2:
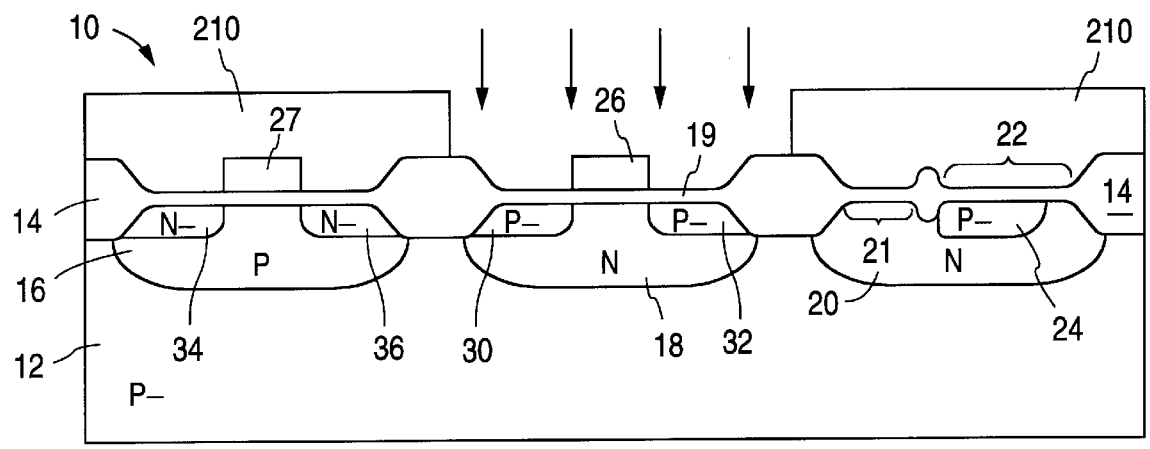

Referring now to FIG. 2, first and second polysilicon gate electrodes 26 and 27 are shown having been formed by well known deposition and etch processes. Additionally, sacrificial oxide layer 15 has been removed and gate oxide layer 19 formed just prior to deposition of gate polysilicon. Typically, gate oxide layer 19 is thermally grown in a well known manner and has a thickness of between 5 and 20 nm although other appropriate thicknesses can also be used. Second masking layer 210 is disposed over substrate 12 and patterned to expose N-well 18. An implantation process using a P-type dopant, for example boron, at an energy between approximately 3 to 100 keV with a dose between approximately $1\times10^{12}$ to $1\times10^{14}$ ions/cm$^2$ is employed to form P-type lightly doped source/drain (LDD) regions 30 and 32. Gate electrode 26 masks a portion of N-well 18 during this implantation, so that an edge of each of regions 30 and 32 is laterally aligned to an edge of gate electrode 26.

Thus LDD regions 30 and 32 are typically referred to as self-aligned. In some embodiments, N-type LDD source and drain regions 34, 36 are formed employing analogous masking and doping steps. In one such embodiment an N-type dopant, for example phosphorus, is implanted at an energy between approximately 3 to 100 keV with a dose between approximately $1\times10^{13}$ to $1\times10^{14}$ ions/cm$^2$.

Figure 3:
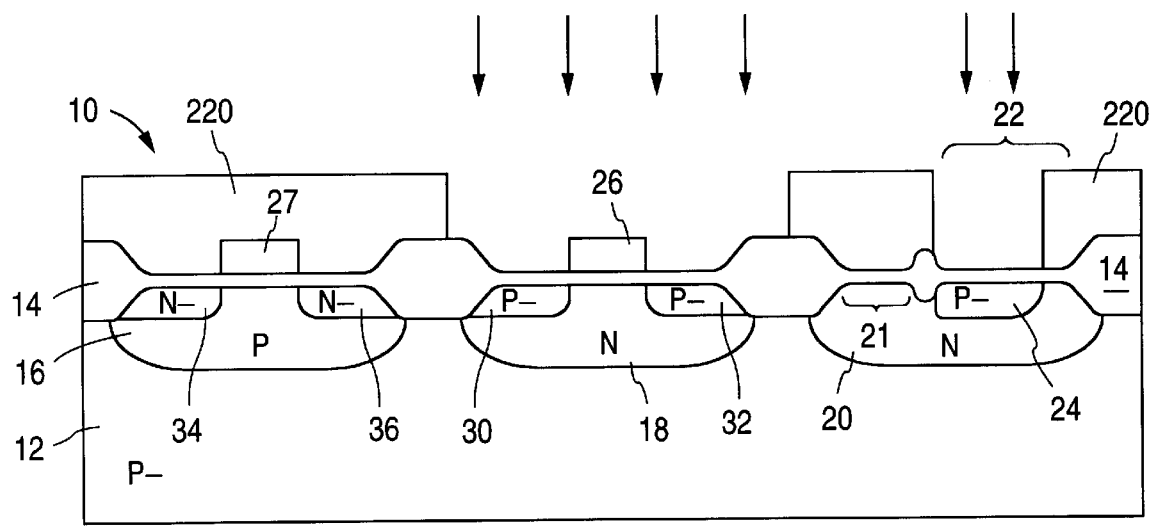

FIG. 3 illustrates an embodiment having an alternate second masking layer 220 where segment 22 of collector 20 is exposed during formation of LDD regions 30 and 32. Thus, P-type extrinsic base 24 is formed in segment 22 of collector region 20 simultaneously with the formation of LDD regions 30 and 32. In a similar manner, N-type LDD regions 34 and 36 can be formed simultaneously with N-type base regions (not shown) if PNP transistors are to be formed in a P-collector region. Thus P-type base 24 and the N-type bases (not shown) may be formed by masking and doping steps as illustrated in FIG. 3 or by masking and doping steps as illustrated in FIG. 1, or by any combination of those processes. Additionally, it has been shown that an extrinsic base region may also be formed by a blanket threshold voltage implant.

Figure 4:
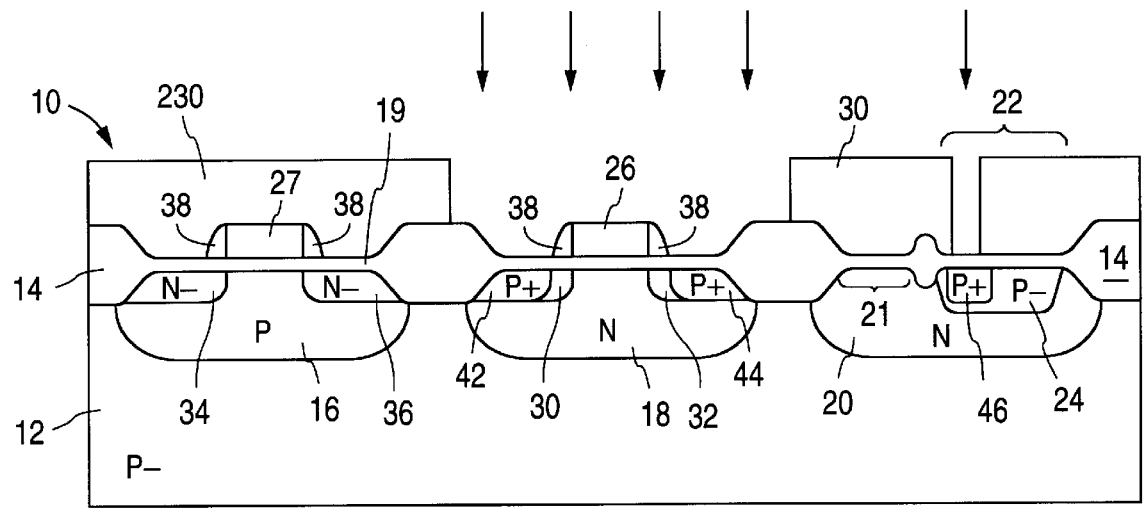

In FIG. 4, sidewall spacers 38 are shown formed adjacent gates 26 and 27. Spacers 38 can be formed using a variety of well known methods to substantially encapsulate gates 26 and 27. Third masking layer 230 is formed to expose an additional selected region of collector 20 and N-well 18. Aforementioned selected regions are implanted using a P-type dopant, such as boron, at an energy between approximately 30 to 100 keV with a dose between approximately $1\times10^{14}$ to $1\times10^{16}$ ions/cm$^2$ to simultaneously form P+ source/drain regions 42, 44 and a P+ base contact enhancement region 46.

Figure 5:
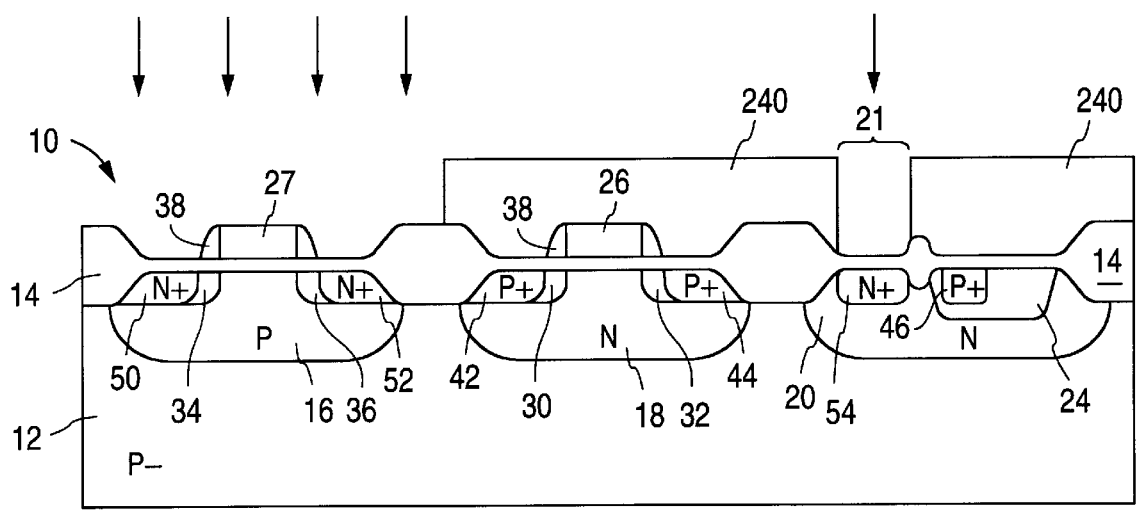

Turning now to FIG. 5, a fourth masking layer 240 is formed leaving exposed still other selected portions of collector region 20 and P-well 16. N+ collector contact enhancement 54 is formed within segment 21 simultaneously with formation of N+ source/drain regions 50 and 52 by implantation with an N-type dopant, for example arsenic, at an energy between approximately 50 to 200 keV with a dose between approximately $1\times10^{15}$ to $1\times10^{16}$ ions/cm$^2$. In some embodiments, masking layer 240 is not critically aligned with respect to collector enhancement region 54, and region 54 is self-aligned to isolation layer 14 within segment 21 as is shown.

Formation of the lightly doped source and drain structures described in FIGS. 2–5 is not required to realize the benefits of the present invention. Transistors without such LDD structures can be employed and the benefits of the present invention realized. In addition, formation of the LDD structures using alternative processing steps is also possible with full realization of the benefits of the present invention. Thus an LDD process employing, for example, disposable spacers could be employed and the full benefits of the present invention realized.

Figure 6:
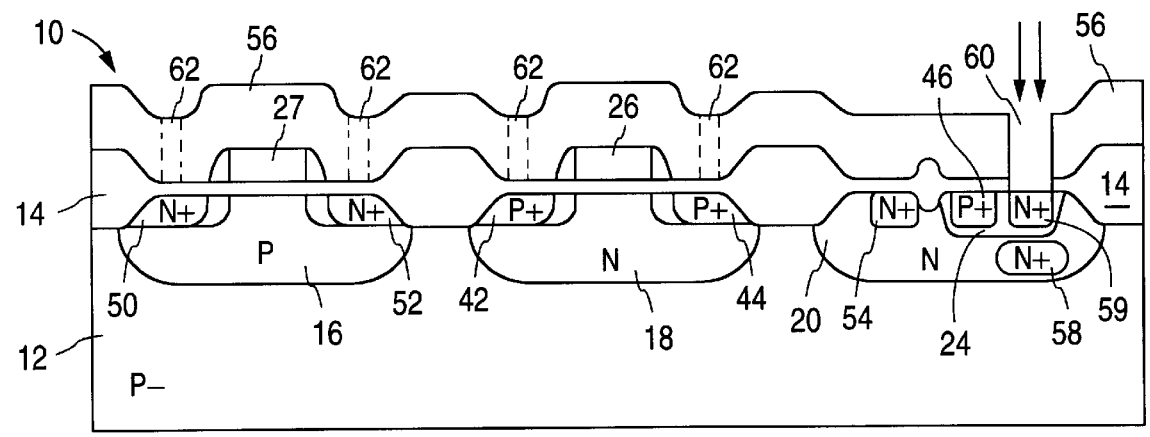

Turning now to FIG. 6, an insulating layer 56 is formed overlying substrate 12. Insulating layer 56 is formed for example by chemical vapor deposition (CVD) of silicon oxide with a thickness of between approximately 100 to 500 nm. Other appropriate thicknesses for layer 56 can also be used. A contact masking layer (not shown) is formed to facilitate the etching away of portions of oxide layer 56, for example openings 62, where electrical contact between a second layer of polysilicon (not shown), e.g. an interconnect layer, and selected regions, e.g. source/drain regions 42, 44, 50 and 52 is desired. However, not all source/drain regions will require such electrical contact, therefore, openings 62 overlying regions 42, 44, 50 and 52 are represented in FIG. 6 with dashed lines to so indicate. In addition, emitter opening 60 is created in oxide layer 56 to expose a portion of collector 20 and provide for formation of an N+ buried layer or N+ buried region 58. Thus, in some embodiments, an optional N+ buried region 58 is formed when an N-type dopant such as phosphorus, is implanted at an energy of approximately 180 keV with a dose of approximately $1 \times 10^{13}$ ions/cm$^2$ through opening 60. The dose used to form buried layer region 58 will also pass through openings 62. Therefore this dose should be selected to prevent conversion of any P-type regions, for example P-well 16, implanted through openings 62.

Buried layer 58, as formed in collector region 20, is formed a predetermined distance below an upper surface of substrate 12. In some embodiments, for example an embodiment using 0.5 μm design rules, the predetermined distance is approximately 0.5–0.7 μm. In other embodiments, using other design rules, the predetermined distance can be another depth. However, as is known, this depth, and the collector resistance of the bipolar transistor formed, can be altered by adjusting the implant energy and dose used to form layer 58. Thus higher energies will increase depth and lower energies will decrease depth. In addition, formation of buried layer 58 through emitter opening 60 provides for a buried layer region 58 aligned essentially only below emitter region 59, once formed. This alignment results in a lowering of base to collector junction capacitance as compared to a structure having a conventional buried layer (not shown). Thus, embodiments of the present invention advantageously eliminate the need for the growth of an epitaxial layer. Accordingly, problems of cost and control associated with an epitaxial layer are avoided.

An emitter region 59 is optionally formed employing a second N-type implantation through opening 60. Upon formation of the aforementioned second polysilicon layer, emitter opening 60 is filled to form therein a polysilicon emitter contact (not shown). Note that in those embodiments in which this optional N-type implantation step is not employed, emitter region 59 is formed by the diffusion of N-type dopants from the second polysilicon layer during deposition and/or subsequent thermal anneals. In still other embodiments, emitter 59 may be formed using the same masking and doping steps used to form collector contact 54, i.e., by modifying masking layer 240 of FIG. 5. In those embodiments where masking layer 240 is modified, the second polysilicon layer will additionally fill opening 60 as previously described. It will be noted that buried layer region 58 is essentially aligned with emitter region 59 as both regions are formed using opening 60.

Conventional CMOS processing techniques may be employed to complete the fabrication of various devices of structure 10, i.e., the formation of interconnect layers, connections to base contact 46 and collector contact 54, and so on.

As it has been shown the present invention allows for the formation of CMOS devices and bipolar devices on a single substrate without any additional masking and doping steps. That is, the fabrication of bipolar devices has been completely integrated within a CMOS process flow. In contrast, conventional BiCMOS fabrication techniques simply insert bipolar processing steps in between selected CMOS processing steps (see Embabi et al., pages 32–38). Thus, the present embodiments allow one to realize the superior circuit performance of BiCMOS devices without unduly increasing fabrication complexity and cost. Further, as mentioned above, embodiments of the present invention also eliminate the need to grow an epitaxial layer. Elimination of an epitaxial layer also eliminates the need to clean the substrate before epitaxial growth, thereby saving additional time and expense. BiCMOS structures formed in accordance with the present invention may be employed in various circuit environments, including but not limited to BiCMOS drivers and emitter-coupled logic circuits.

In addition, note that buried layer region 58 is formed after CMOS wells are formed. Thus thermal cycles typically employed to bring such N-wells and P-wells to exhibit desired characteristics cannot cause lateral diffusion of buried layer regions seen in conventional BiCMOS processing. Additionally, these P and N wells can be formed to maximize CMOS performance without regard for previously formed buried layer regions of conventional BiCMOS processes. Thus, the fabrication of structure 10 is accomplished solely by modification of selected CMOS process steps, without the need for additional, bipolar specific process steps. In addition where optional methods of forming bipolar structures have been described, one or several of these methods can be advantageously employed to form the bipolar structures. In this manner, a high performance BiCMOS integrated circuit is fabricated with a fully integrated CMOS process flow.

Other embodiments, in accordance with the present invention, can employ a single-poly CMOS process which utilizes buried contacts, as described with reference to structure 100 of FIGS. 7–12. For ease of understanding, some elements common to structures 10 and 100 are identically labeled.

Figure 7:
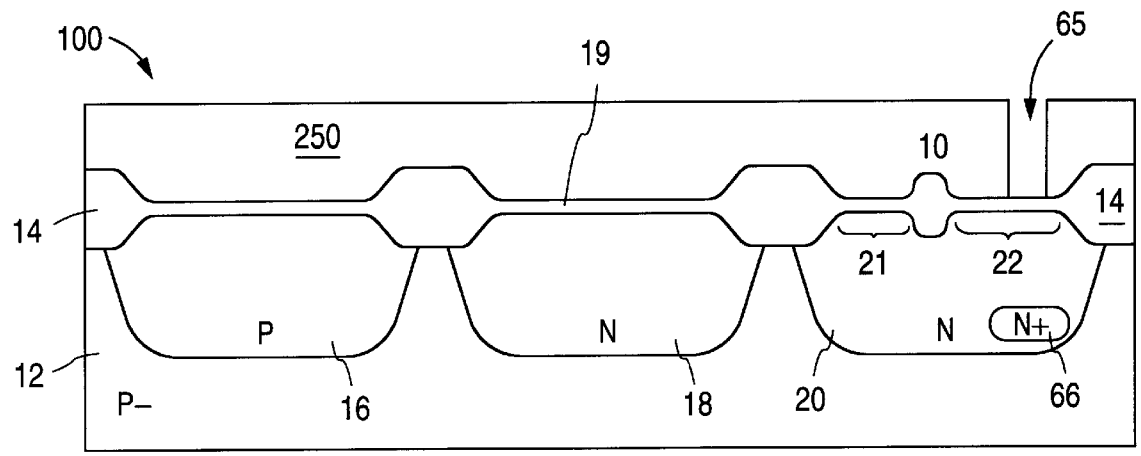
FIGS. 7, 8, 9, 10, 11 and 12 are simplified cross-sectional views of a semiconductor structure illustrating various steps in the fabrication of a BiCMOS integrated circuit employing a single polysilicon CMOS process embodiment of the present invention.

Referring now to FIG. 7 a simplified cross-sectional view of structure 100, at an early stage of a single polysilicon CMOS flow is shown. Structure 100 includes a P-type substrate 12 having formed thereon a layer of field oxide and gate oxide layer 19. Field oxide layer 14 is formed using a well known LOCOS process and gate oxide layer 19 is typically formed by a well known thermal oxidation process to a thickness of between 5 and 20 nm, although other appropriate thicknesses can also be used.

As was discussed with respect to structure 10, substrate 12 can, for instance, be a P-type substrate having a thickness and resistivity selected to produce the desired characteristics of devices of an actual embodiment. In addition, as for structure 10, the benefits of the present invention can be realized for structure 100 where the conductivity types described are reversed.

P-well region 16, N-well region 18 and N-type collector region 20 are formed by the methods described previously for structure 10. Using a well known LOCOS process, field oxide 14 is formed so as to provide an optional segmented structure for N-type collector 20 as illustrated and previously discussed with respect to structure 10, as well as to provide electrical isolation for P-type and N-type wells and collector regions.

A buried contact masking layer 250, typically photoresist, is formed overlying structure 100 and patterned to form opening 65 overlying second segment 22 of N-type collector region 20. While only one opening 65 is shown in FIG. 7, this is for simplicity and ease of understanding only. Other openings 65, for example, overlying P-wells 16, can also be used to form a buried contact. Thus N+ buried region or layer 66 is formed by implantation of an N-type dopant through opening 65. Typically phosphorus, implanted at an energy of approximately 180 keV with a dose of approximately $1 \times 10^{13}$ to $1 \times 10^4$ ions/cm$^2$, is employed to form buried layer region 66.

Figure 8:
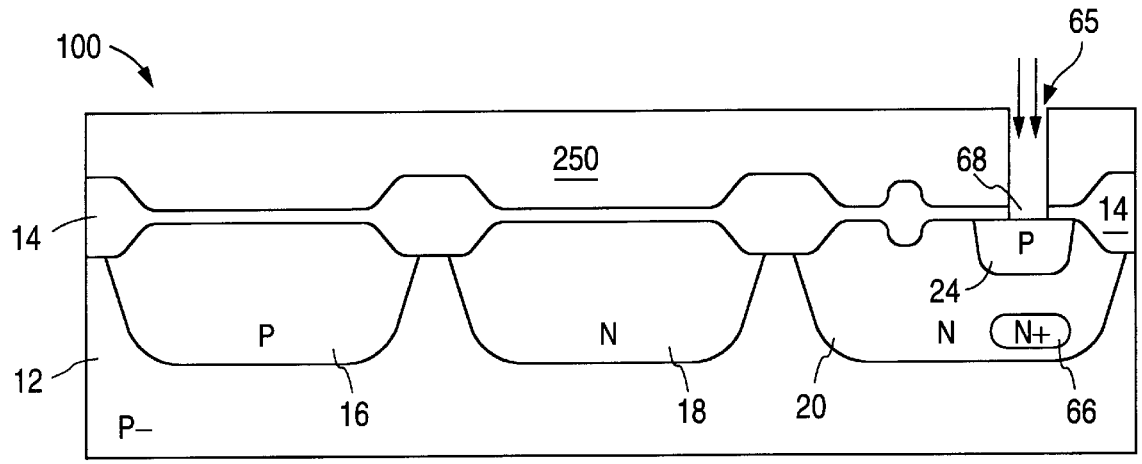

Turning now to FIG. 8, extrinsic base region 24 is shown formed employing an optional implantation step. When this optional step is employed, P-type dopants, such as boron, are implanted at an energy of approximately 25 keV with a dose of approximately $1\times10^{12}$ to $1\times10^{14}$ ions/cm$^2$ through opening 65 after formation of region 66. A portion of gate oxide layer 19 is removed after implant using a suitable etchant, leaving a portion 68 of substrate 12 exposed. In other embodiments, base region 24 can be formed simultaneously with the implanting of P-type dopants into N-well 18 to form P type source and drain regions as described previously with respect to structure 10.

Optionally, a thin polysilicon layer (not shown) can be disposed overlying structure 100 before masking layer 250 is formed. Such a polysilicon layer is typically approximately 30 to 50 nm thick and provides protection to gate oxide layer 19 from subsequent masking and etching steps.

Figure 9:
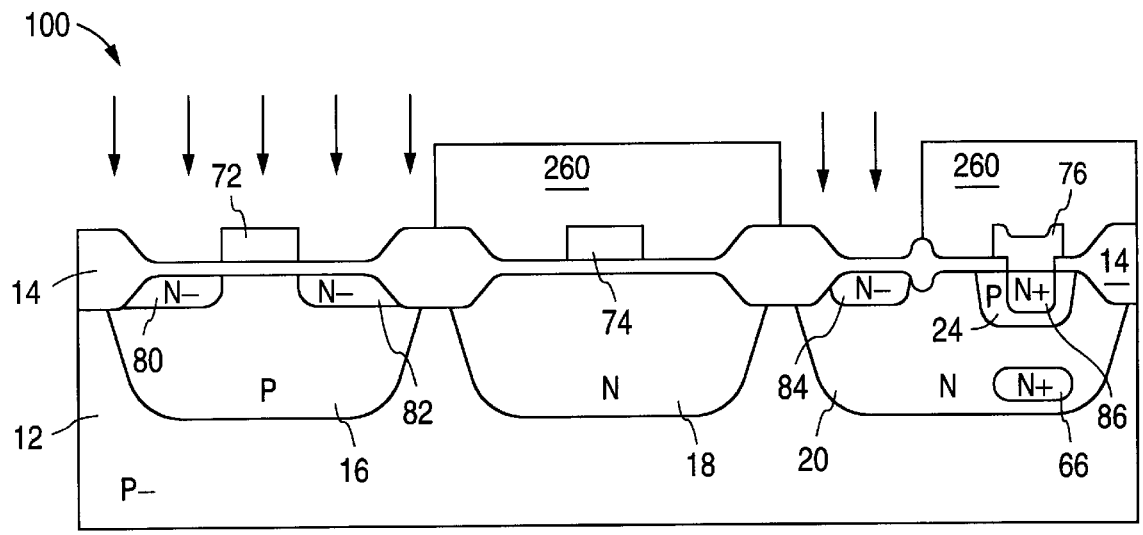

Referring to FIG. 9, a thick layer of polysilicon, for example between approximately 100 to 400 nm thick, is deposited and patterned in a well known manner to form a gate 72 over P-well 16, a gate 74 over N-well 18, and an emitter contact 76. Note that in some embodiments, where the aforementioned thin polysilicon layer is formed, gates 72 and 74 consist of stacked thin and thick polysilicon layers. However, as a portion of gate oxide layer 19 and any optional thin polysilicon layer is removed after the implantation step in which buried layer 66 is formed, the optional base implant, emitter contact 76 is formed only from the second, thick polysilicon layer. Of course while specific ranges for the aforementioned thin and thick polysilicon layers are given, other appropriate thicknesses can also be employed.

A masking layer 260 is formed and patterned to expose P-well 16 and segment 21 of N-type collector 20. N-type dopants such as phosphorus are implanted at an energy of approximately 3 to 100 keV with a dose of approximately $1\times10^{13}$ to $1\times10^{14}$ ions/cm$^2$ to form self-aligned LDD source drain regions 80 and 82, and a collector contact region 84. In other embodiments, masking layer 260 may be modified in a manner such that collector contact 84 is not formed simultaneously with lightly doped source and drains 80 and 82. For example, as will be seen, collector contact 84 can be formed during implantation of heavily doped source/drain regions 96 and 98 (see FIG. 11). Emitter region 86 is formed from diffusion of N-type dopants within polysilicon emitter contact 76 into substrate 12. Formation of emitter region 86 will occur during any and all subsequent anneal steps. As was seen for structure 10, emitter region 86 and buried layer region 66 are essentially aligned with one another.

Figures 10, 11, 12:
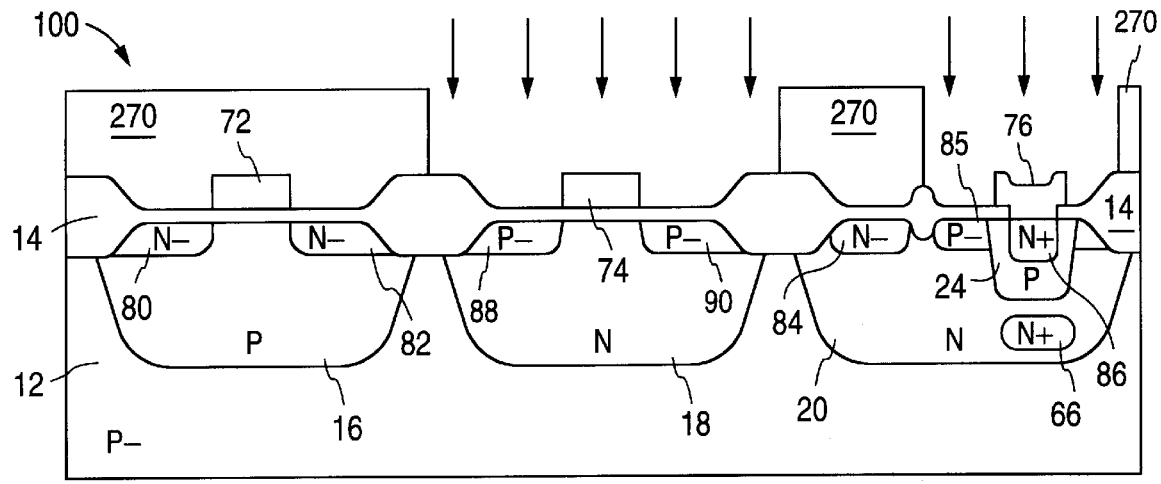

Turning now to FIG. 10, masking layer 270 is formed and patterned to expose N-well 18 and segment 22 of collector 20. P-type LDD source/drain regions 88 and 90 and P-type base regions 85 are formed by implantation of N-type dopants such as boron. In one such embodiment, boron is implanted at an energy of approximately 3 to 100 keV with a dose of approximately $1\times10^{12}$ to $1\times10^{14}$ ions/cm$^2$. It is to be understood that in a similar manner, masking layer 270 may be altered to provide for simultaneous doping of N-type base regions (not shown) and N-type lightly doped source 80 and drain 82 regions. Sidewall spacers 92 (FIG. 11) are then formed to substantially encapsulate gates 72, 74 and emitter contact 76 in a well known manner. An optional doping step (not shown) may be employed to further dope base 24 to a desired conductivity and/or to provide base regions 85 (FIG. 10). This optional doping step may be implemented either in a blanket fashion or with a suitable mask. Masking layer 280 (FIG. 11) is then formed overlying structure 100 as shown in FIG. 11. An N-type dopant, for example arsenic, is implanted into regions of structure 100 left exposed by masking layer 280 at an energy of approximately 50–200 keV with a dose of approximately $1\times10^{15}$ is to $1\times10^{16}$ ions/cm$^2$ to form N+ source/drain regions 96 and 98 and to further dope N+ collector contact 84. Note that in other embodiments masking layer 260 of FIG. 9 can be modified such that collector contact 84 is initially defined by masking layer 280.

Turning now to FIG. 12, a masking layer 290 is formed and patterned. P+ dopants, for example boron, are implanted at an energy of approximately 30 to 100 keV with a dose of approximately $1\times10^{14}$ to $1\times10^{16}$ ions/cm$^2$ to simultaneously form P+ source/drain regions 102 and 104 and P+ base contact 106.

Conventional CMOS processing techniques may be employed to complete the fabrication of various devices of structure 100, i.e., the formation of interconnect layers and insulating layers and so on as previously discussed with respect to structure 10.

Thus, the fabrication of structure 100 in accordance with the present invention is accomplished by modifying selected CMOS process steps so as to incorporate therein the formation of bipolar devices. In this manner, BiCMOS devices may be fabricated without a need to add bipolar process steps into a CMOS process flow. Thus, a BiCMOS integrated circuit is fabricated with a fully integrated CMOS process flow. In addition, it is a particulate advantage of the present invention that where formation of bipolar and CMOS regions can be accomplished simultaneously at alternate implant steps in the integrated CMOS process flow, it is understood that tailoring of a region's specific dopant profile can be accomplished by implanting the region at more than one step. For example, base region 24 can be formed, as discussed with respect to FIG. 1, simultaneously with threshold voltage adjust region 17 and can be additionally doped simultaneously to the formation of LDD regions 30 and 32, as discussed with respect to FIG. 3. Accordingly, the advantages discussed above with respect to structure 10 are equally applicable to embodiments discussed herein with reference to structure 100.

While particular embodiments of the present invention have been shown and described, changes and modifications may be made without departing from this invention in its broader aspects and, therefore, the appended claims are to encompass within their scope all such changes and modifications as fall within the true spirit and scope of this invention. Specifically, it is to be understood that the particular order in which the bipolar components are formed may be varied while still realizing the benefits of the present invention, and thus such a change falls within the scope and spirit of the present invention.

We claim:

1. A method of manufacturing a BiCMOS integrated circuit fully integrated within a CMOS process flow comprising the steps of:

providing a semiconductor substrate without an epitaxial layer having a first well of a first dopant type;

forming a second well and a collector region of a second dopant type opposite that of the first dopant type within said semiconductor substrate;

forming an isolation structure for electrically isolating said first well, said second well and said collector region;

selectively doping said semiconductor substrate wherein a base region is formed aligned within a portion of said collector region and one of a threshold voltage adjust region or aligned lightly doped source and drain regions within said second well are simultaneously formed of the first dopant type;

forming a first gate electrode and a second gate electrode overlying selected portions of said first and second wells respectively;

forming first source and drain regions of the second dopant type within said first well;

forming second source and drain regions of the first dopant type within said second well; and forming an emitter region within a selected portion of said base region.

2. The method of claim 1 wherein said second well and said collector region are formed simultaneously.

3. The method of claim 1 wherein the step of selectively doping said semiconductor substrate comprises forming said base region and said threshold voltage adjust region simultaneously.

4. The method of claim 3 comprising doping said semiconductor substrate wherein said lightly doped source and drain regions are formed aligned to and adjacent said second gate electrode.

5. The method of claim 1 wherein the step of forming first source and drain regions further comprises simultaneously forming a collector contact region of the second dopant type within said collector region.

6. The method of claim 1 wherein the step of forming second source and drain regions further comprises simultaneously forming a base contact region of the first dopant type within said base region.

7. The method of claim 1 further comprising the steps of:
forming a collector contact region of the second dopant type within said collector region simultaneous to forming said first source and drain regions; and forming a base contact region of the first dopant type within said base region simultaneous to forming said second source and drain regions.

8. The method of claim 7 wherein the step of forming said isolation structure further comprises said isolation structure defining a first segment and a second segment within said collector region.

9. The method of claim 8 wherein said base region is formed within said first segment.

10. The method of claim 7 wherein said collector contact region is formed within said second segment and said base contact region is formed within said first segment.

11. The method of claim 1 wherein the step of forming said emitter region is simultaneous to forming said first source and drain regions.

12. The method of claim 1 wherein the step of forming said emitter region comprises forming a polysilicon layer.

13. The method of claim 12 wherein forming the polysilicon layer further comprises patterning said polysilicon layer to form said first gate electrode, said second gate electrode and a polysilicon emitter contact.

14. The method of claim 1 further comprising a step of selectively implanting said collector region with a dopant of the second type, wherein a buried layer region is formed a predetermined distance below said emitter region.

15. A method of fabricating an integrated circuit having bipolar and CMOS transistors comprising the steps of:
providing a semiconductor substrate without an epitaxial layer having a first well of a first dopant type;

simultaneously forming a second well and a collector region of a second dopant type within said semiconductor substrate;

forming an isolation structure wherein said collector region comprises a first segment and a second segment;

forming a first and a second gate electrode overlying a portion of said first well and a portion said second well, respectively;

forming a base region of the first dopant type, wherein said base region is formed aligned with said first segment of said collector region;

simultaneously forming source and drain regions within said second well region aligned to edges of said second gate electrode and a base contact enhancement in a selected portion of said base region, wherein said source and drain regions and said base contact enhancement are formed of the dopant of a first type; and forming an emitter region of the second dopant type within said base region proximate said base enhancement.

16. A method of manufacturing an integrated circuit having both bipolar and CMOS transistors within a common semiconductor substrate, comprising the steps of:
providing said semiconductor substrate without an epitaxial layer having a well of a first dopant type formed therein;

doping selected portions of said semiconductor substrate with a dopant of a second dopant type wherein a second well and a collector region are simultaneously formed;

forming an isolation structure for electrically isolating said first well, said second well and said collector region;

forming a base region of the first dopant type self-aligned with a first portion of said collector region;

doping said semiconductor substrate with a dopant of the first type wherein a source region and a drain region within said first well are formed simultaneously with a collector contact enhancement region, wherein said collector enhancement region is within a second portion of said collector region, proximate said base region; and selectively doping a portion of said base region with a dopant of the second type wherein an emitter region is formed therein.

17. A method for forming a BiCMOS integrated circuit comprising the steps of:
providing a semiconductor substrate without an epitaxial layer, said semiconductor substrate having an upper surface;

selectively doping said semiconductor substrate with a dopant of a first conductivity type wherein a first well region is formed;

selectively doping said semiconductor substrate with a dopant of a second conductivity type, opposite the first conductivity type, wherein a second well region and a collector region are formed simultaneously, said regions each having a first concentration of the dopant of the second conductivity type;

forming an isolation structure in said semiconductor substrate wherein said collector region is segmented to have a first segment and a second segment;

selectively doping said semiconductor substrate wherein a base region aligned with said first segment and having a first concentration of the dopant of the first conductivity type is formed simultaneously with one of a threshold voltage adjust region or lightly doped source/drain regions within said second well region;

forming first and second gates over said first and second well regions, respectively;

selectively doping said base region and said second well region with a dopant of the first conductivity type wherein a base contact enhancement region having a second concentration greater than the first concentration of dopant of the first type and source/drain regions are simultaneously formed within said base region and said second well respectively;

selectively doping said collector region and said first well region with a dopant of the second conductivity type wherein a collector contact enhancement region having a second concentration greater than the first concentration of the dopant of the second type and source/drain regions are simultaneously formed within said collector region and said first well respectively; and forming an emitter region adjacent said upper surface wherein said emitter region is within said base region and proximate said base contact enhancement region.

18. The method of claim 17, further comprising a step of forming an isolation structure for isolating said first well region, said second well region and said collector region wherein said isolation structure further forms a first segment and a second segment of said collector region.

19. The method of claim 18 wherein the step of forming an isolation structure comprises forming a LOCOS isolation structure.

20. The method of claim 18 wherein forming said base region comprises selectively doping said first segment.

21. The method of claim 18, wherein forming said collector contact enhancement region comprises selectively doping said second segment.

22. The method of claim 21, wherein said collector contact enhancement region is self-aligned to a portion of said isolation structure.

23. The method of claim 17, further comprising the step of selectively implanting said collector region with a dopant of a second type at a first energy wherein said first energy is sufficient to form a buried layer region a predetermined distance from said upper surface.

24. The method of claim 23 wherein said predetermined distance positions said buried layer region below said emitter region.

25. The method of claim 17 wherein forming said base region further comprises doping said region simultaneously with said threshold voltage adjust region and said lightly doped source/drain regions.

26. The method of claim 17 wherein forming said emitter region comprises selectively doping said base region and said first well region with a dopant of the second conductivity type wherein said emitter region and source/drain regions are simultaneously formed within said base region and said first well region respectively.

27. The method of claim 17 wherein a polysilicon layer is patterned to form a polysilicon emitter contact.

28. The method of claim 27 wherein said polysilicon layer is patterned to form gate electrodes simultaneously with said polysilicon emitter contact.

29. The method of claim 27 wherein said polysilicon layer is patterned to form a polysilicon interconnect layer simultaneously with said polysilicon emitter contact.

* * * * *